United States Patent
Divakaruni et al.

(10) Patent No.: US 6,940,149 B1
(45) Date of Patent: Sep. 6, 2005

(54) STRUCTURE AND METHOD OF FORMING A BIPOLAR TRANSISTOR HAVING A VOID BETWEEN EMITTER AND EXTRINSIC BASE

(75) Inventors: Rama Divakaruni, Ossining, NY (US); Gregory Freeman, Hopewell Junction, NY (US); Marwan Khater, Poughkeepsie, NY (US); William Tonti, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 18 days.

(21) Appl. No.: 10/708,563

(22) Filed: Mar. 11, 2004

(51) Int. Cl.[7] .............................................. H01L 27/082
(52) U.S. Cl. ...................... 257/565; 438/205; 438/313; 438/340
(58) Field of Search .......................... 257/565; 438/205, 438/313, 340

(56) References Cited

U.S. PATENT DOCUMENTS

| | | | |
|---|---|---|---|
| 4,994,400 A | * | 2/1991 | Yamaguchi et al. ......... 438/367 |
| 5,128,271 A | | 7/1992 | Bronner et al. |
| 5,494,836 A | | 2/1996 | Imai |
| 5,506,427 A | | 4/1996 | Imai |
| 5,962,880 A | | 10/1999 | Oda et al. |
| 6,346,453 B1 | | 2/2002 | Kovacic et al. |
| 6,548,882 B1 | * | 4/2003 | Zwicknegl et al. |
| 6,586,782 B1 | * | 7/2003 | Finlay ........................ 257/197 |
| 6,777,782 B1 | * | 8/2004 | Esselfie |
| 6,806,554 B2 | * | 10/2004 | Hsu |
| 2003/0057458 A1 | | 3/2003 | Freeman et al. |
| 2003/0109109 A1 | | 6/2003 | Freeman et al. |

OTHER PUBLICATIONS

Jagannathan, et al., "Self–aligned SiGe NPN Transistors with 285 GHz fMax and 207 GHz fT in a Manufacturable Technology". IEEE Electron Device letters 23, 259 (2002).

J.S. Rieh, et al., "SiGe HBTs with Cut–off Frequency of 350 GHz", International Electron Device Meeting Technical Digest, 771 (2002).

M.W. Xu et al. "Ultra Low Power SiGe:C HBT for 0.18 um RF–FiCMOS," Proceedings of the IEEE International Electron Devices Meeting, 2003.

* cited by examiner

*Primary Examiner*—Fetsum Abraham
(74) *Attorney, Agent, or Firm*—Daryl K. Neff; H. Daniel Schnurmann

(57) ABSTRACT

Structure and a method are provided for making a bipolar transistor, the bipolar transistor including a collector, an intrinsic base overlying the collector, an emitter overlying the intrinsic base, and an extrinsic base spaced from the emitter by a gap, the gap including at least one of an air gap and a vacuum void.

20 Claims, 13 Drawing Sheets

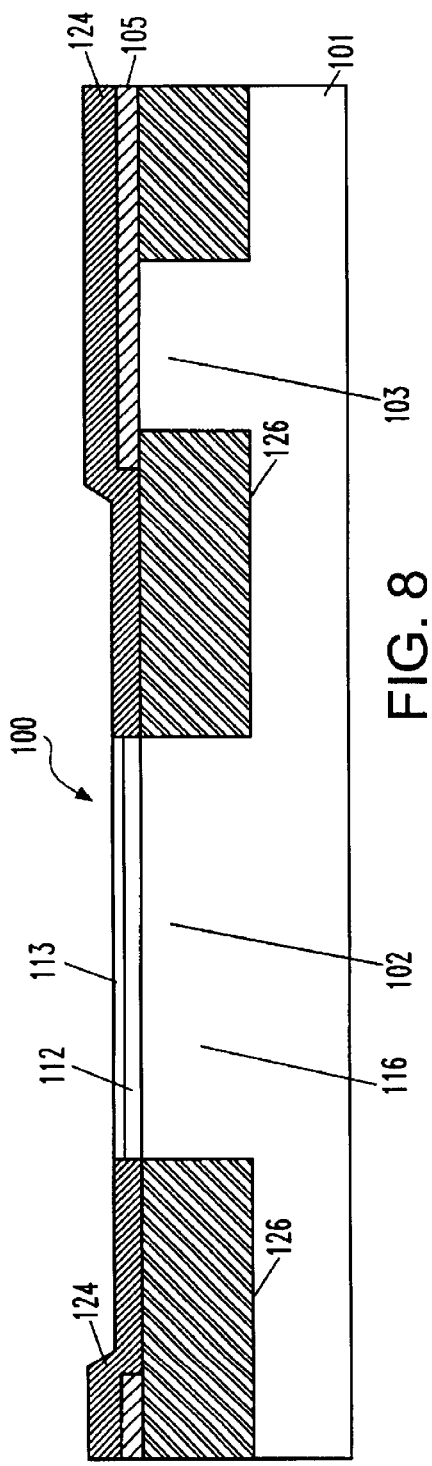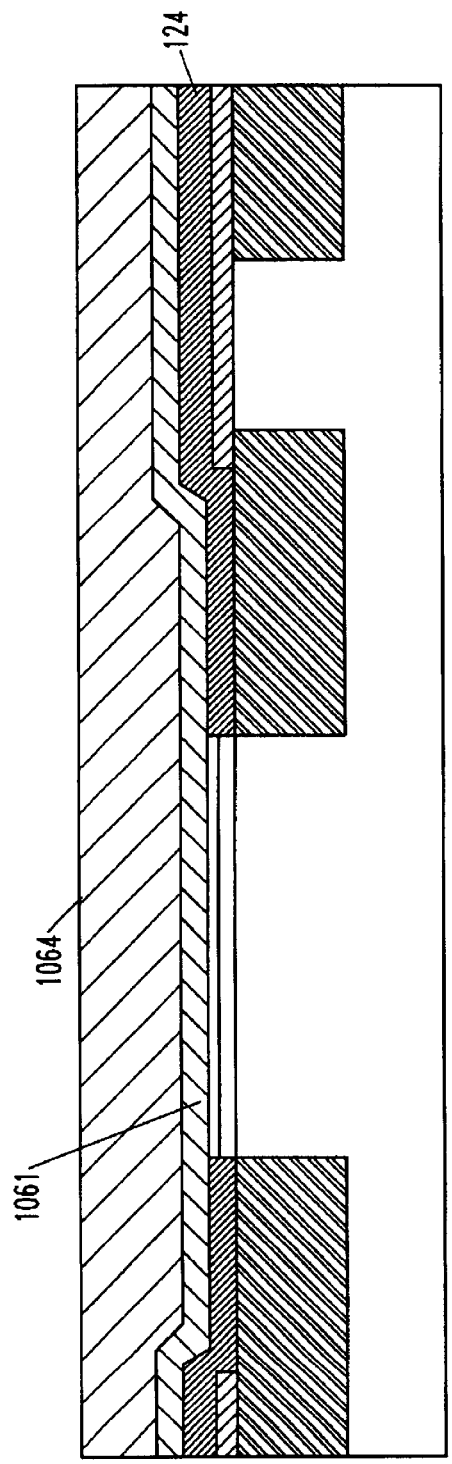

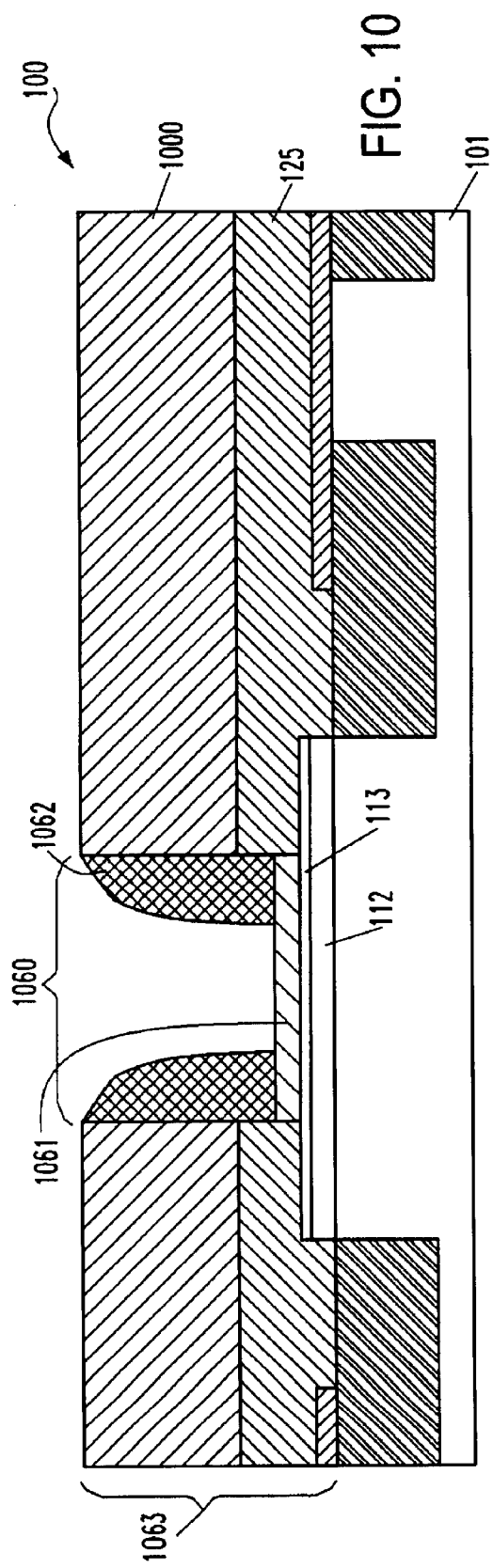
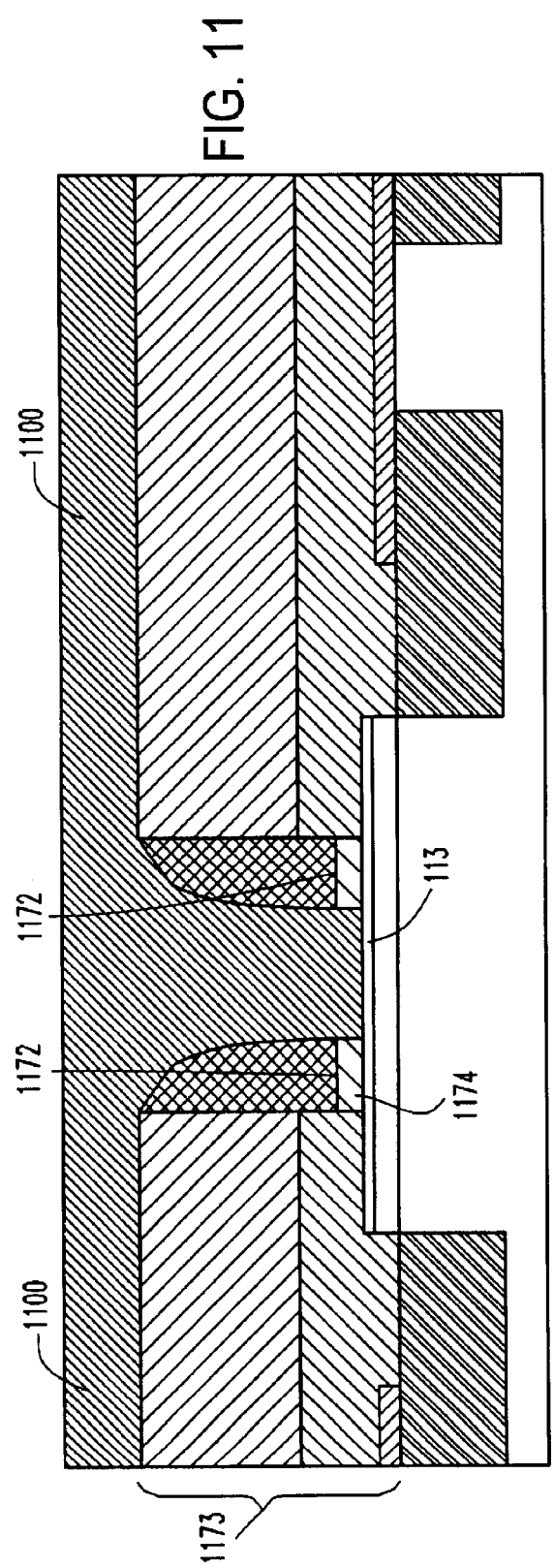

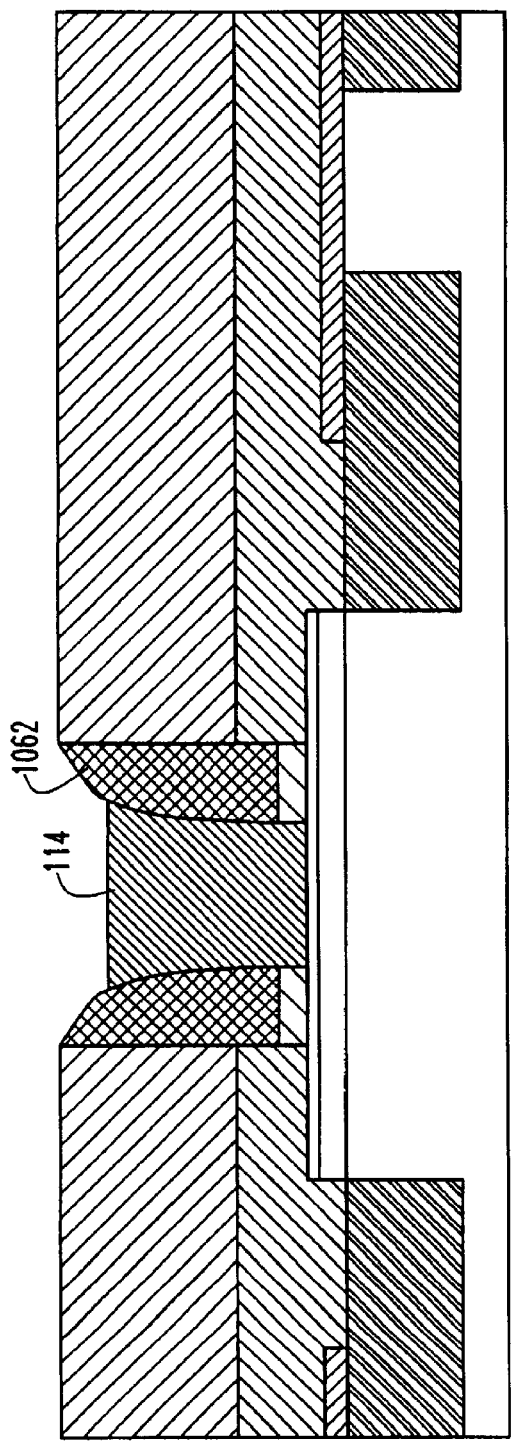
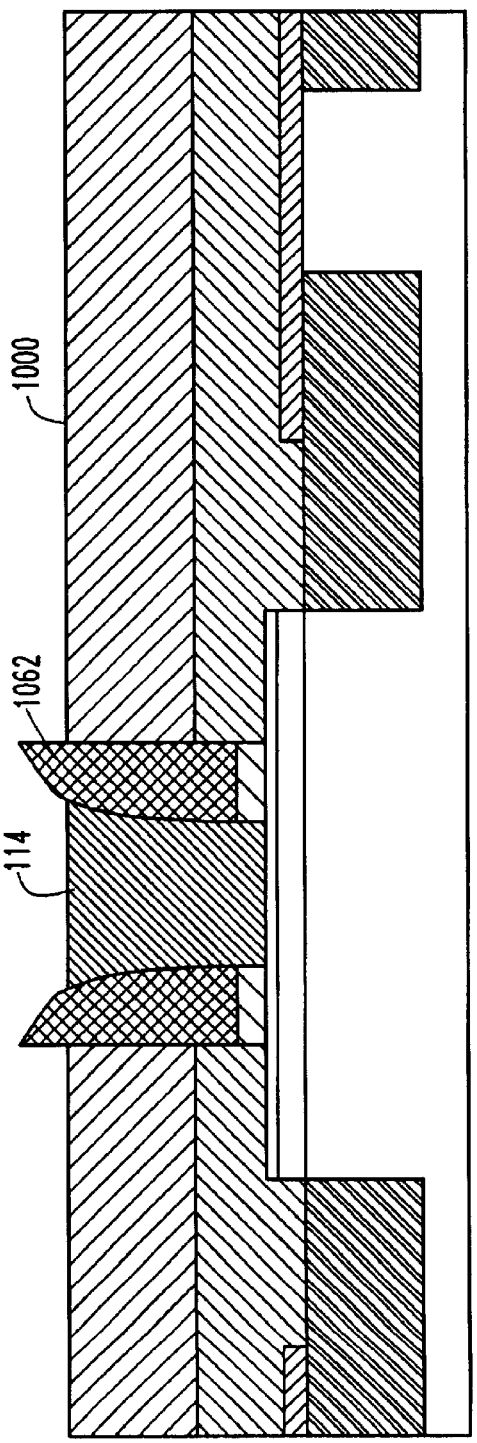

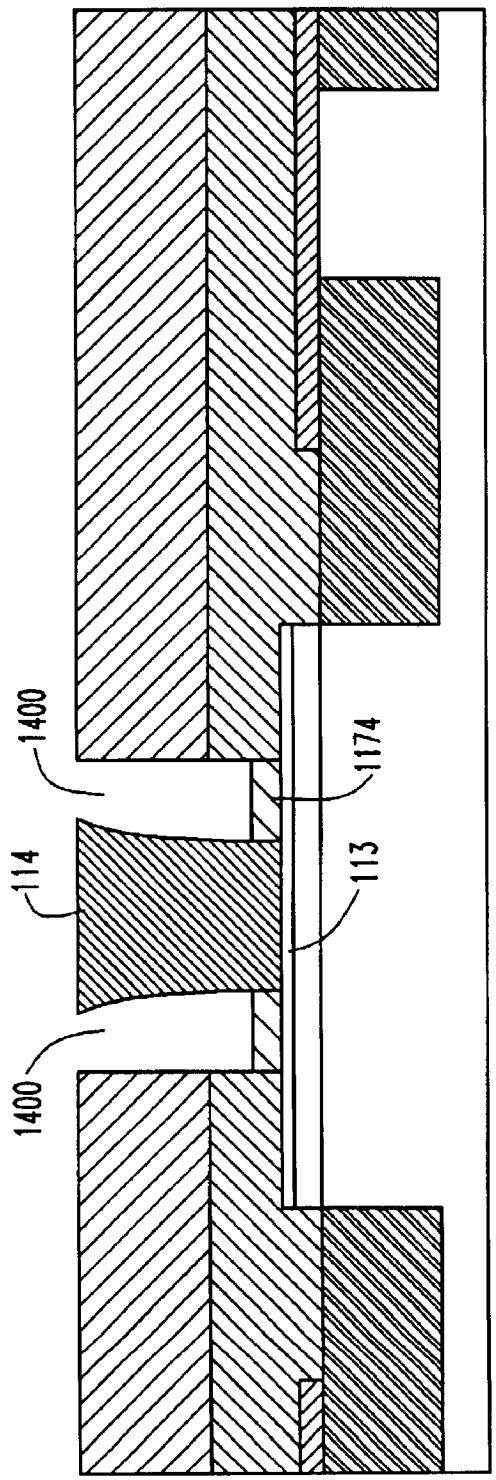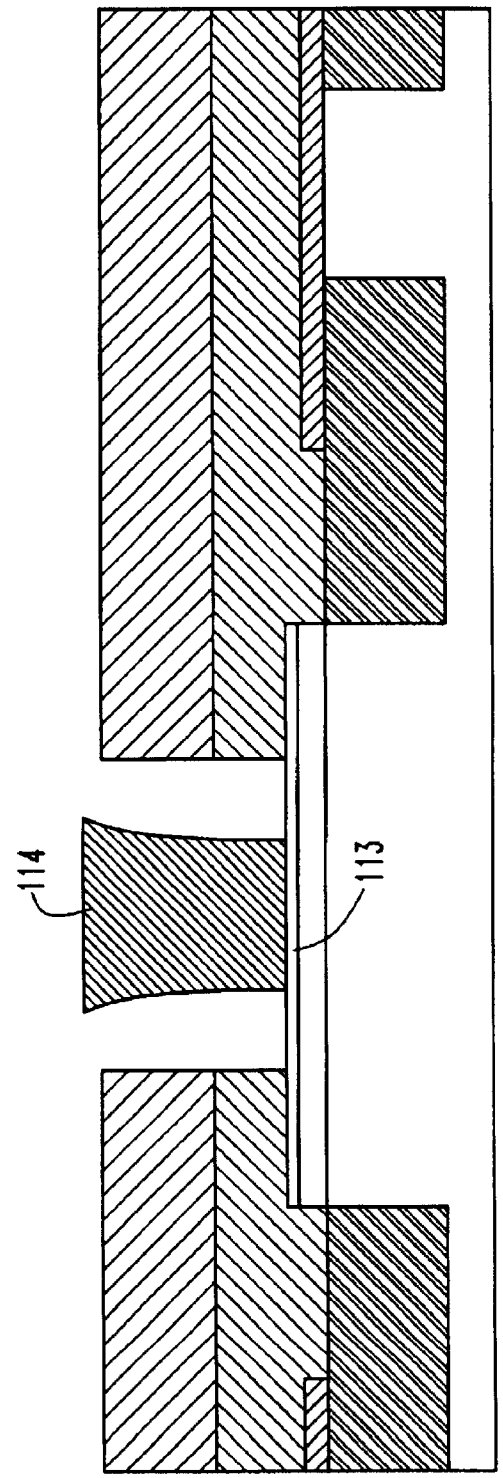

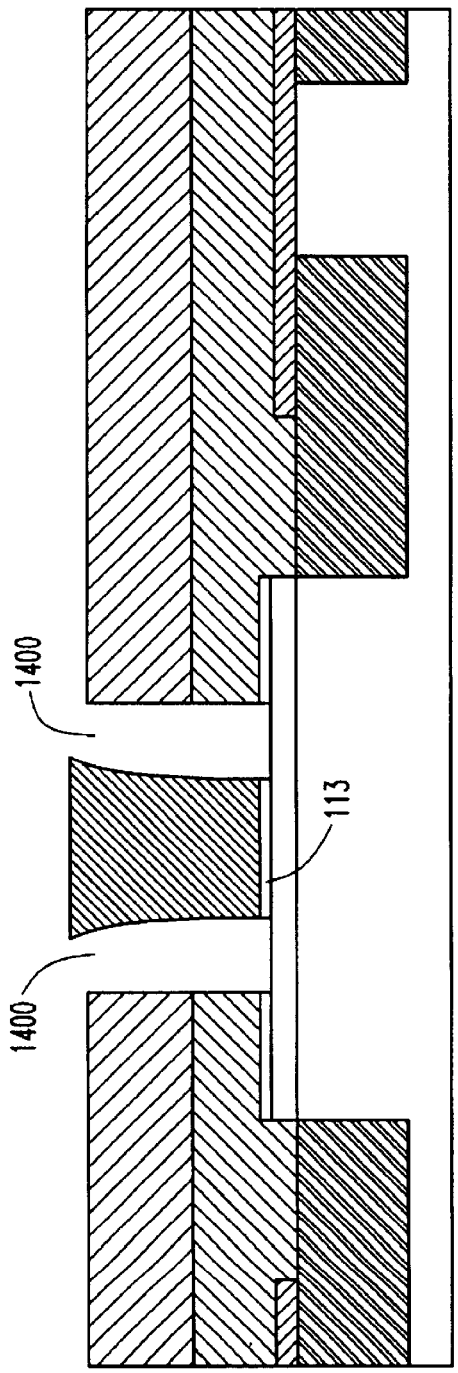
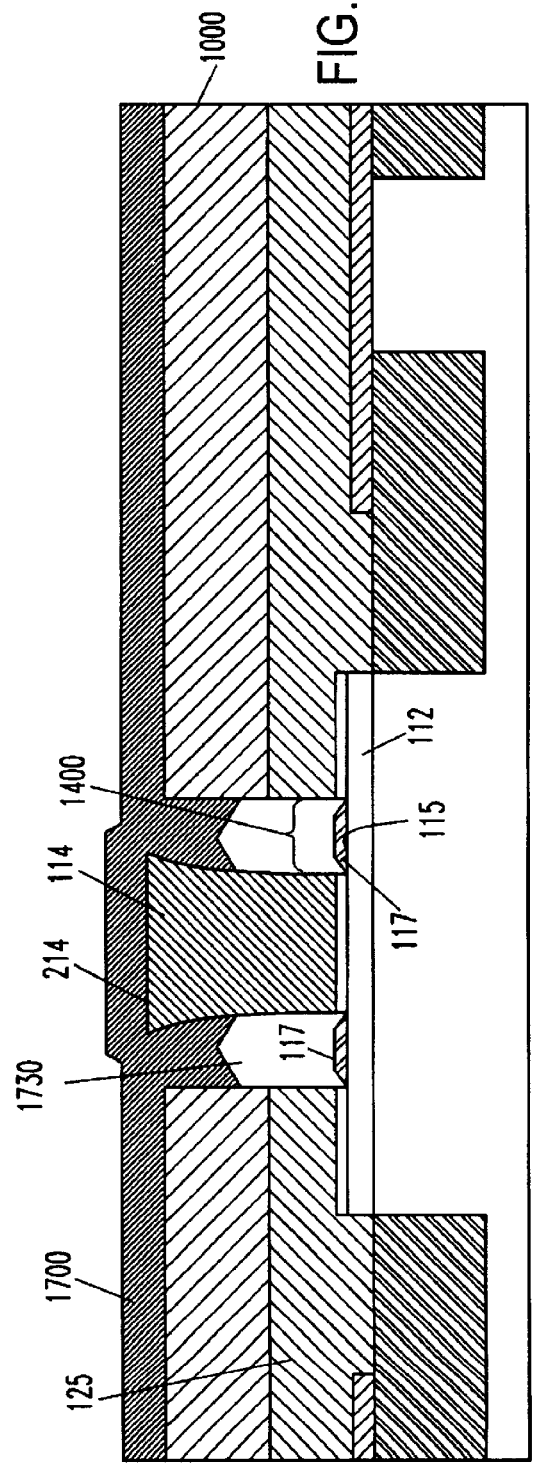

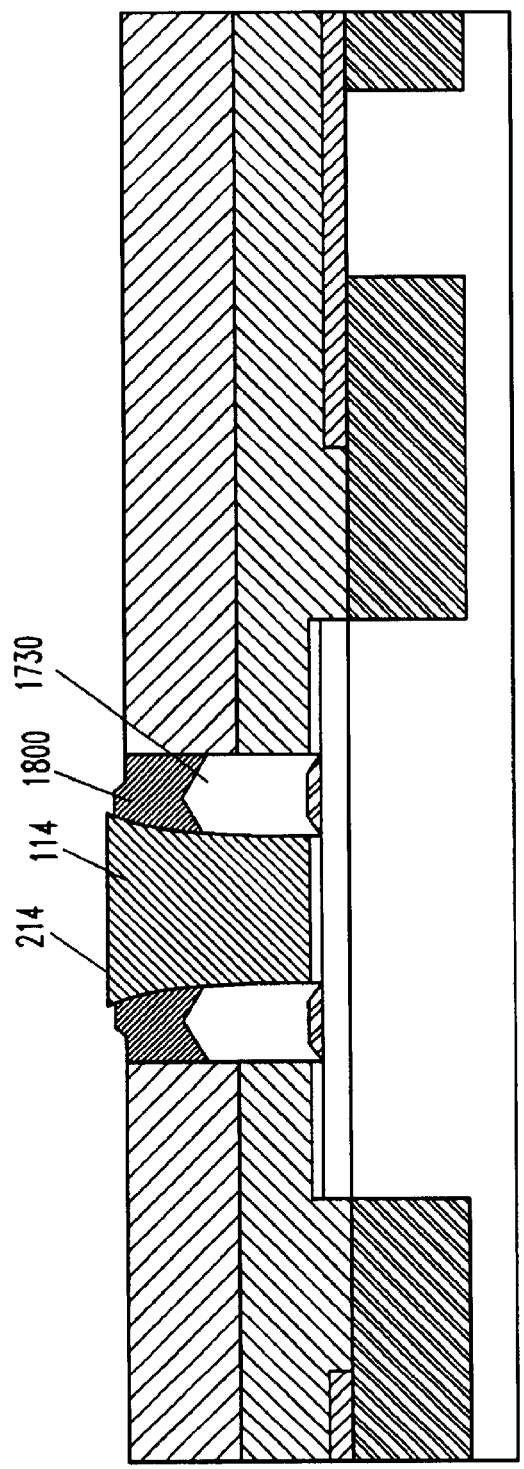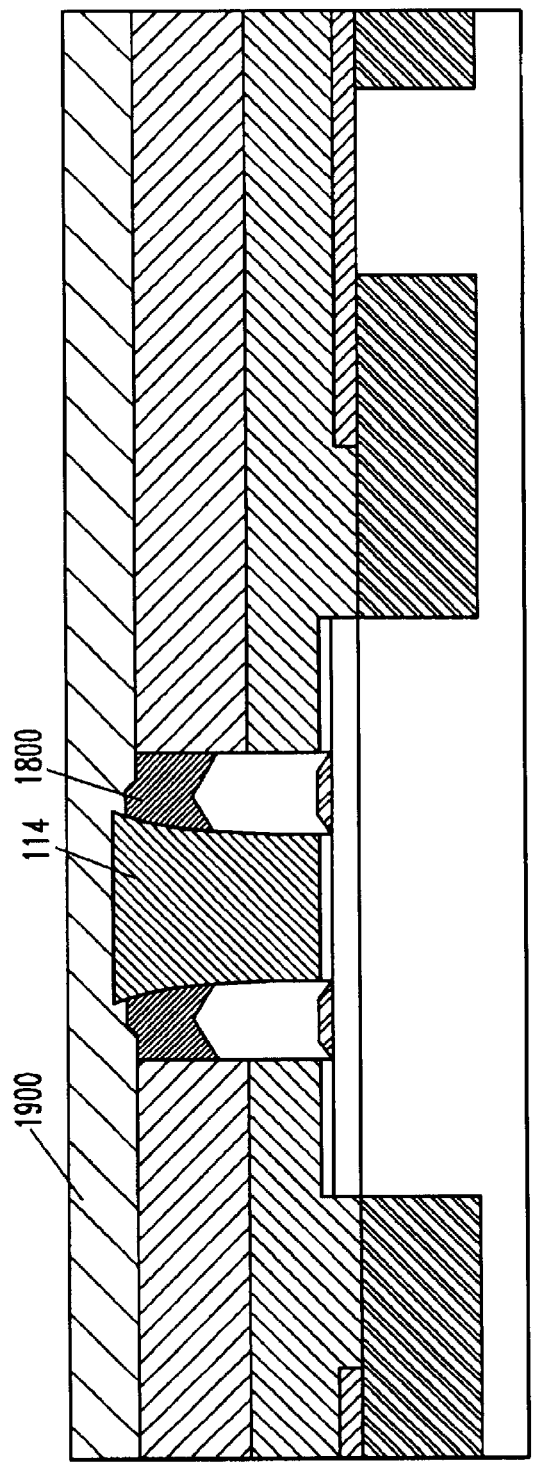

STRUCTURE AND METHOD OF FORMING A BIPOLAR TRANSISTOR HAVING A VOID BETWEEN EMITTER AND EXTRINSIC BASE

BACKGROUND OF INVENTION

The present invention relates to bipolar transistors and their fabrication, especially heterojunction bipolar transistors utilized in high-speed integrated circuits.

High performance circuits, especially those used for radio frequency chips, favor the use of heterojunction bipolar transistors (HBTs) to provide high maximum oscillation frequency $f_{MAX}$ and high transient frequency $f_T$, also referred to as "cutoff frequency". HBTs have a structure in which the base of the transistor includes a relatively thin layer of single-crystal semiconductor alloy material. As an example, an HBT fabricated on a substrate of single-crystal silicon can have a single-crystal base formed of silicon germanium (SiGe) having substantial germanium content and profile to improve high-speed performance. Such HBT is commonly referred to as a SiGe HBT.

A particularly advantageous type of HBT has a "graded base" in which the content of particular semiconductor materials varies according to depth within the base of the transistor. For example, in some graded base HBTs which have a base including SiGe, the germanium content varies continuously with depth across the thickness of the SiGe layer. In such "graded-base HBT, a significant quasi-electric field results during operation that decreases the transit time of charge carriers through the base. Decreased transit time, in turn, enables higher gain and cutoff frequency to be achieved than in transistors having the same semiconductor material throughout.

To increase the performance of an HBT, it is desirable to increase the transit frequency $f_T$, and the maximum oscillation frequency $f_{MAX}$. The transit frequency $f_T$ is the frequency at which the current gain of the transistor decreases to unity such that the HBT no longer amplifies currents above that frequency. $F_{MAX}$ is a function of $f_T$ and of parasitic resistances and parasitic capacitances (collectively referred to herein as "parasitics") between elements of the transistor according to the formula $$f_{MAX} = (f_T/8\Pi C_{cb} R_b)^{1/2}.$$

The parasitics of the HBT include the following parasitic capacitances and resistances, as listed in Table 1:

TABLE 1

| | |
|---|---|
| $C_{cb}$ | collector-base capacitance |
| $C_{eb}$ | emitter-base capacitance |
| $R_c$ | collector resistance |
| $R_e$ | Remitter resistance |
| $R_b$ | base resistance |

The parasitics having the most significant effect on performance are the collector-base capacitance $C_{cb}$ and the base resistance $R_b$. The charging of the parasitic $C_{cb}$ through the parasitic $R_b$ has the greatest impact on power delivery that is reflected in the $f_{MAX}$ figure of merit. On the other hand, the emitter-base capacitance $C_{eb}$ is the parasitic having the single largest capacitance. As explained more fully below, the value of $C_{eb}$ indirectly but profoundly affects the value of $C_{cb}$, in that large $C_{eb}$ requires high operational current. High operational current can require that the base have a high concentration of charge carriers. The ability of the device to sustain a high charge carrier concentration without the base dimension expanding during operation due to the well-known "base push-out effect" comes at the expense of increased $C_{cb}$. Thus, it is desirable to provide an HBT structure and method by which $C_{eb}$ and $C_{cb}$ are significantly reduced.

An example of a state of the art heterojunction bipolar-transistor (HBT) structure containing parasitics is illustrated in FIG. 1. As depicted in the cross-sectional view therein, an ideal or "intrinsic" device consists of a one-dimensional slice downward through the centerline 2 of the HBT, through emitter 4, intrinsic base layer 3, and collector 6. The emitter 4 is generally heavily doped with a particular dopant type, (e.g. n-type), and generally consists essentially of polycrystalline silicon (hereinafter, "polysilicon"). The intrinsic base 3 is predominantly doped with the opposite type dopant (e.g. p-type), and less heavily than the emitter 4. The collector 6 is doped predominantly with the same dopant (e.g. n-type) as the emitter 4, but even less heavily than the intrinsic base 3. Region 5 represents the depletion region disposed between the intrinsic base 3 and the collector 6, due to the p-n junction between the base and collector, which have different predominant dopant types. Region 7 represents the depletion region disposed between the intrinsic base 3 and the emitter 4, due to the p-n junction between the base and emitter, which have different predominant dopant types. Often, the intrinsic base 3 is formed of silicon germanium (SiGe), which is epitaxially grown on the surface of the underlying collector 6.

The ideal structure itself contains two capacitances that impact performance. There is the intrinsic emitter-base capacitance $C_{BE,I}$ at the junction 7 between the emitter 4 and the base 3. In addition, there is an intrinsic collector base capacitance $C_{CB,I}$ at the junction 5 between the collector and the base. These capacitances are related to the areas of the respective junctions, as well as to the quantities of dopant on either side of the respective junctions. Although these capacitances impact the power gain of the transistor, they are an inextricable part of the ideal transistor structure and thus cannot be fully eliminated. Since a one-dimensional transistor, free of all material beyond the intrinsic device, cannot be realized in a practical process, typically a transistor contains additional parasitics stemming from interaction between the intrinsic device and other material structures in which the intrinsic device is embedded, such structures helping to provide electrical access to and heat transfer from the intrinsic device. Among such additional parasitics is the extrinsic emitter base capacitance, shown in FIG. 1 as $C_{BE,E}$ 8. In higher performance transistors the dimension of the emitter in the lateral dimension is generally made smaller, in order to reduce the parasitic resistances. In such transistors, the region surrounding the emitter becomes larger for the same device area. As a result, the extrinsic portion of the emitter-base capacitance $C_{EB,E}$ increases as a proportion of the total emitter-base capacitance. Reductions in $C_{EB,E}$, therefore, produce increasing benefits as the device dimensions decrease.

Through the well-known relation that transit time ($\sim 1/f_T$) is proportional to $(C_{eb} + C_{cb})/I_C$ (where $I_C$ is the collector current), and the observation that $C_{eb}$ is generally significantly larger than $C_{cb}$, one can observe that $f_T$ and $f_{MAX}$ performance increase with decreasing $C_{eb}$. Alternatively, the reduction in $C_{eb}$ is matched by a similar reduction in $I_C$, resulting in the same performance at a lower power. With lower $I_C$ required for the needed performance, the collector doping can be reduced, which in turn causes the value of $C_{cb}$ to fall, as a result. In such way, a reduction in $C_{eb}$ will indirectly result in a decrease in $C_{cb}$ and an increase in $f_{MAX}$.

Therefore, it would be desirable to provide a structure and method of fabricating a bipolar transistor having reduced extrinsic emitter base capacitance $C_{EB,E}$ so as to achieve superior high-frequency current and power gain.

As provided by the prior art, differences exist among SiGe HBTs which allow them to achieve higher performance, or to be more easily fabricated. A cross-sectional view of one such prior art SiGe HBT 10 is illustrated in FIG. 2. Such non-self-aligned HBT 10 can be fabricated relatively easily, but other designs provide better performance. As depicted in FIG. 2, the HBT 10 includes an intrinsic base 12, which is disposed in vertical relation between the emitter 14 and the collector 16. The intrinsic base 12 includes a single-crystal layer of SiGe (a single-crystal of silicon germanium having a substantial proportion of germanium). The SiGe layer forms a heterojunction with the collector 16 and a relatively thin layer of single-crystal silicon 13 which is typically present in the space between the SiGe layer and the emitter 14.

A raised extrinsic base 18 is disposed over the intrinsic base 12 as an annular structure surrounding the emitter 14. The purpose of the raised extrinsic base 18 is to inject a base current into the intrinsic base 12. For good performance, the interface 24 between the raised extrinsic base 18 and the intrinsic base is close to the junction between the emitter 14 and the intrinsic base 12. By making this distance small, the resistance across the intrinsic base 12 between the interface 24 and the emitter 14 is decreased, thereby reducing the base resistance $R_b$ (hence RC delay) of the HBT 10. It is desirable that the interface 24 to the raised extrinsic base be self-aligned to the edge of the emitter 14. Such self-alignment would exist if the raised extrinsic base were spaced from the emitter 14 only by the width of one or more dielectric spacers formed on a sidewall of the raised extrinsic base 18.

However, in the HBT 10 shown in FIG. 2, the interface 24 is not self-aligned to the emitter 14, and the distance separating them is not as small or as symmetric as desirable. A dielectric landing pad, portions 21, 22 of which are visible in the view of FIG. 2, is disposed as an annular structure surrounding the emitter 14. Portions 21, 22 of the landing pad separate the raised extrinsic base 18 from the intrinsic base 12 on different sides of the emitter 14, making the two structures not self-aligned. Moreover, as shown in FIG. 2, because of imperfect alignment between lithography steps used to define the edges of portions 21 and 22 and those used to define the emitter opening, the lengths of portions 21 and 22 can become non-symmetric about the emitter opening, causing performance to vary.

The landing pad functions as a sacrificial etch stop layer during fabrication. The formation of the landing pad and its use are as follows. After forming the SiGe layer of the intrinsic base 12 by epitaxial growth onto the underlying substrate 11, a layer of silicon 13 is formed over the SiGe layer 12. A layer of silicon dioxide is deposited as the landing pad and is then photolithographically patterned to expose the layer 13 of single-crystal silicon. This photolithographic patterning defines the locations of interface 24 at the edges of landing pad portions 21, 22, which will be disposed thereafter to the left and the right of the emitter 14. A layer of polysilicon is then deposited to a desired thickness, from which layer the extrinsic base 18 will be formed.

Thereafter, an opening is formed in the polysilicon by anisotropically etching the polysilicon layer (as by a reactive ion etch) selectively to silicon dioxide, such etch stopping on the landing pad. After forming a spacer in the opening, the landing pad is then wet etched within the opening to expose silicon layer 13 and SiGe layer 12. A problem of the non-self-aligned structure of HBT 10 is high base resistance $R_b$. Resistance is a function of the distance of a conductive path, divided by the cross-sectional area of the path. As the SiGe layer 12 is a relatively thin layer, significant resistance can be encountered by current traversing the distance from the extrinsic base under landing pad portions 21, 22 to the area of the intrinsic base 12 under the emitter 14, such resistance limiting the high speed performance of the transistor.

FIG. 3 is a cross-sectional view illustrating another HBT 50 according to the prior art. Like HBT 10, HBT 50 includes an intrinsic base 52 having a layer of silicon germanium and an extrinsic base 58 consisting of polysilicon in contact with the single-crystal intrinsic base 52. However, unlike HBT 10, HBT SO does not include landing pad portions 21, 22, but rather, the raised extrinsic base 58 is self-aligned to the emitter 54, the extrinsic base 58 being spaced from the emitter 54 by dielectric spacer. Self-aligned HBT structures such as HBT 50 have demonstrated high $f_T$ and $f_{MAX}$ as reported in Jagannathan, et al., "Self-aligned SiGe NPN Transistors with 285 GHz $f_{MAX}$ and 207 GHz $f_T$ in a Manufacturable Technology," IEEE Electron Device letters 23, 258 (2002) and J. S. Rieh, et al., "SiGe HBTs with Cut-off Frequency of 350 GHz," International Electron Device Meeting Technical Digest, 771 (2002). In such self-aligned HBT structures, the emitter 54 is self-aligned to the raised extrinsic base 58.

Several methods are provided by art which is background to the present invention for fabricating an HBT 50 such as that shown in FIG. 3. According to one approach, chemical mechanical polishing (CMP) is used to planarize the extrinsic base polysilicon over a pre-defined sacrificial emitter pedestal, as described in U.S. Pat. Nos. 5,128,271 and 6,346,453. A drawback of this method is that the extrinsic base layer thickness, hence the base resistance $R_b$, can vary significantly between small and large devices, as well as, between low and high density areas of devices due to dishing of the polysilicon during CMP.

In another approach, described in U.S. Pat. Nos. 5,494,836; 5,506,427; and 5,962,880, the intrinsic base is grown using selective epitaxy inside an emitter opening and under an overhanging polysilicon layer of the extrinsic base. In this approach, self-alignment of the emitter to the extrinsic base is achieved by the epitaxially grown material under the overhang. However, with this approach, special crystal growth techniques are required to ensure good, low-resistance contact between the intrinsic base and the extrinsic base.

As described in commonly assigned, co-pending U.S. patent application Ser. No. 09/962,738 of Freeman et al. filed Sep. 25, 2001, a self-aligned HBT is formed by a process including chemical mechanical polishing (CMP) steps. In such process, as shown in FIGS. 4A–4C, the intrinsic base 60 is formed by non-selective epitaxy over the collector 62. A raised extrinsic base 64 is formed by depositing polysilicon in an opening which has an upwardly projecting mandrel 66 in the center of the opening. Thereafter, as shown in FIG. 4B, the polysilicon is recessed by etching selectively to an exterior material of the mandrel, and a layer 68 of oxide is deposited in the opening. The oxide layer is then polished to the level of the mandrel and then the mandrel is thereafter removed, as shown in FIG. 4C. While the process described therein self-aligns the raised extrinsic base to the emitter, the base resistance $R_b$ is dependent upon the accuracy and uniformity of recessing the polysilicon layer.

The article by M. W. Xu et al entitled "Ultra Low Power SiGe:C HBT for 0.18 μm RF-BiCMOS" published in Proceedings of the IEEE International Electron Devices Meeting, 2003 describes a method of optimizing the dimension of the emitter layer and its dopant profile in order to reduce the intrinsic portion of the emitter-base capacitance ($C_{EB,I}$). However, the techniques proposed therein result in a larger space charge region between the emitter and the base of the transistor, which reduces peak performance.

Another technique for reducing the intrinsic portion of the emitter-base capacitance ($C_{EB,I}$) is described in commonly owned, co-pending U.S. patent application Ser. No. 10/008,383 filed Dec. 6, 2001. According to such technique, as illustrated in FIGS. 5 and 6, the depth of the emitter 62 is intentionally varied, such that it has a lower depth D2 at the center of the transistor, while its depth D1 is greater at the perimeter. At high current injection the device perimeter dominates the transistor operation and the center is mostly parasitic. Under such conditions, this technique provides a more optimal structure for establishing a low CBE transistor.

It is desirable to provide a self-aligned HBT and method for making such HBT that reduces the extrinsic portion of the emitter-base capacitance ($C_{EB,E}$), i.e., the capacitance outside of the operational portion of the transistor between the dielectric spacers 21, 22 (FIG. 2). Referring to illustrative FIG. 2, significant contributions to the $C_{BE,E}$ parasitic capacitance are provided where the emitter 14 is disposed in close proximity to the base 12 and 18 across a dielectric region or spacer. Additional parasitic capacitance results from the junction of the emitter layer with the base under and beyond the spacers 21, 22. There is opportunity for reducing the extrinsic emitter-base capacitance ($C_{EB,E}$) and obtaining consequent performance enhancements. It would further be desirable to reduce the overall emitter-base capacitance without having to increase the thickness of the space charge region of the emitter and suffer loss of peak performance.

It would further be desirable to lower overall emitter-base capacitance, to permit the collector base capacitance to be lowered as a result.

SUMMARY OF INVENTION

According to aspects of the invention, a structure and a method are provided for making a bipolar transistor, the bipolar transistor including a collector, an intrinsic base overlying the collector, an emitter overlying the intrinsic base, and an extrinsic base spaced from the emitter by a gap, the gap including at least one of an air gap and a vacuum void.

BRIEF DESCRIPTION OF DRAWINGS

FIGS. 8 through 20 illustrate a method of fabricating the heterojunction bipolar transistor illustrated in FIG. 7, according to an embodiment of the invention.

DETAILED DESCRIPTION

The embodiments of the invention described herein provide a structure and method for forming a bipolar transistor having reduced collector-base capacitance (C cb). Reducing the collector-base capacitance affects the power gain of the transistor, helping to increase $f_T$ and $f_{MAX}$. According to the embodiments of the invention, these goals are furthered without significant impact to series resistance ($R_c$) or base resistance ($R_b$), thus enabling improvements to be achieved in the gain and frequency range of a bipolar transistor.

The bipolar transistor according to the various embodiments described herein includes an "air gap", i.e. a gap filled with any suitable one or combination of gases or a vacuum void (hereinafter "gap") in the place of a traditional solid dielectric spacer of silicon nitride or silicon dioxide between the emitter and the raised extrinsic base. The use of a gap in place of such solid dielectric reduces the dielectric constant by a 3:1 ratio or greater and reduces the fringing portion of the capacitance between the emitter and the raised extrinsic base to the same degree.

In a particular embodiment of the invention, the semiconductor material is recessed in the area below the gap between the emitter and the raised extrinsic base. This has the effect of reducing the perimeter component of the junction in the semiconductor material, and helping to further reduce the emitter—base capacitance.

Figure 1:
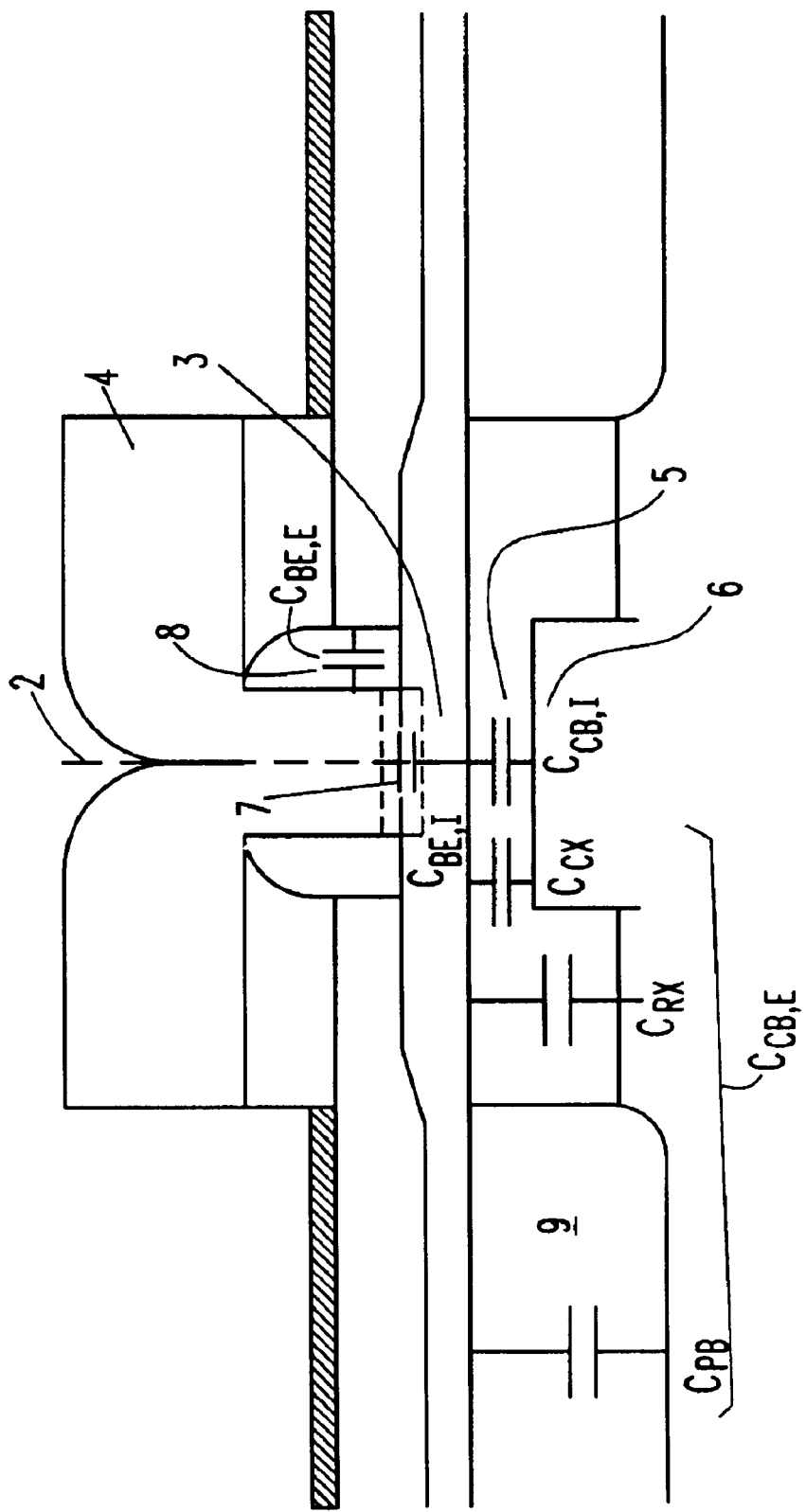
FIG. 1 illustrates components of collector base capacitance in relation to the structure of an HBT.
Figure 2:
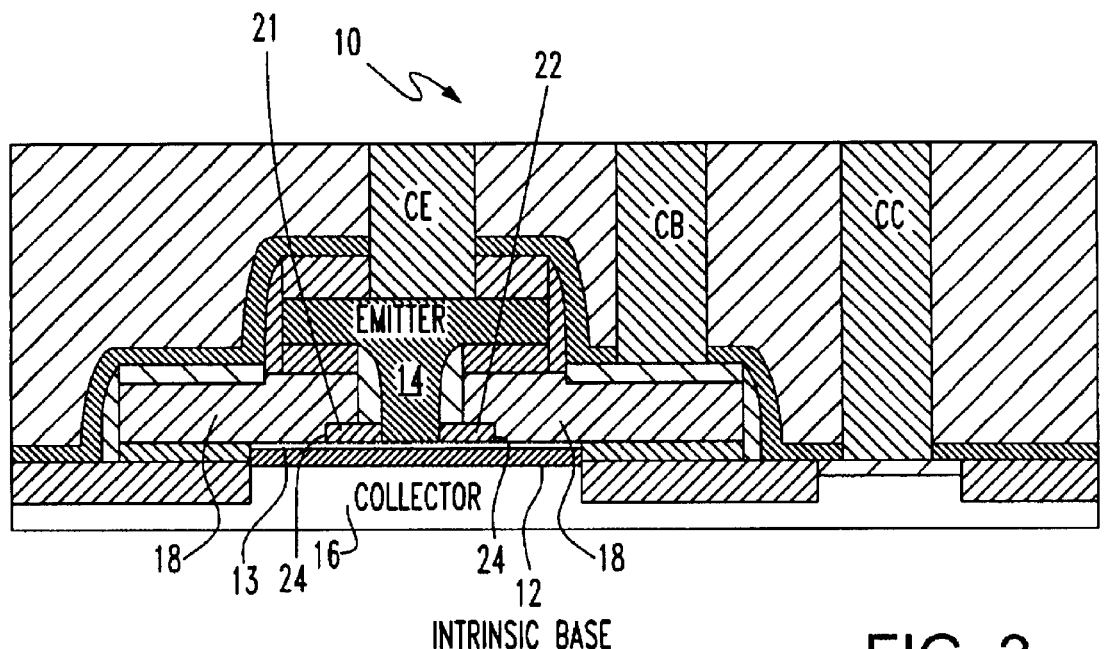
FIG. 2 illustrates a non-self-aligned heterojunction bipolar transistor according to the prior art, in which the raised extrinsic base is formed of polysilicon and is not self-aligned to the emitter.
Figure 3:
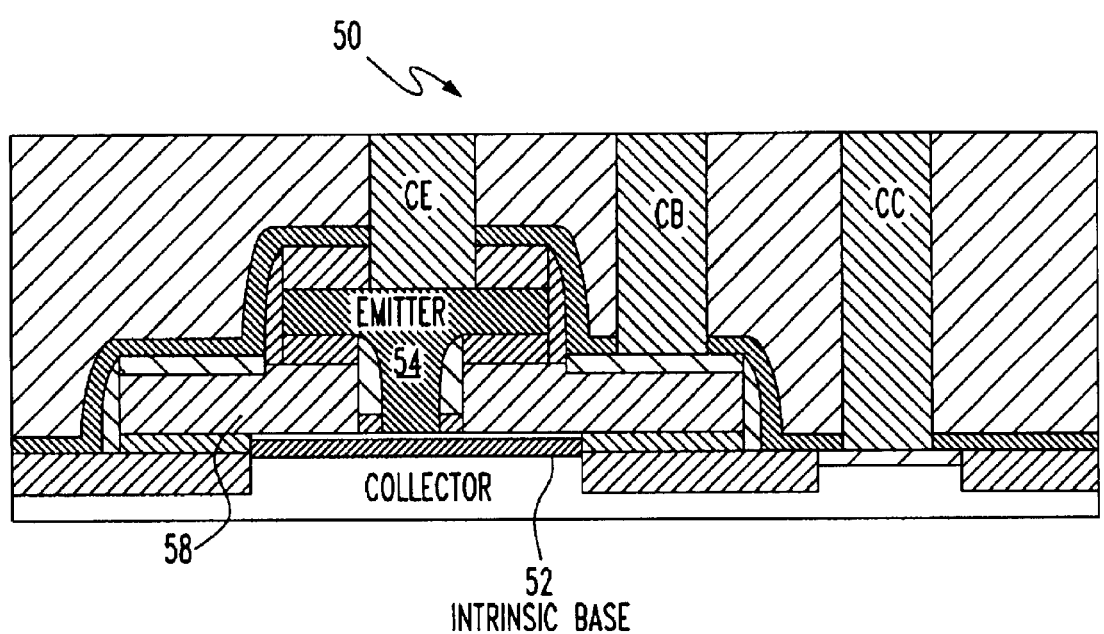
FIG. 3 illustrates a self-aligned heterojunction bipolar transistor according to the prior art, in which the raised extrinsic base is formed of polysilicon and is self-aligned to the emitter.
Figure 4:
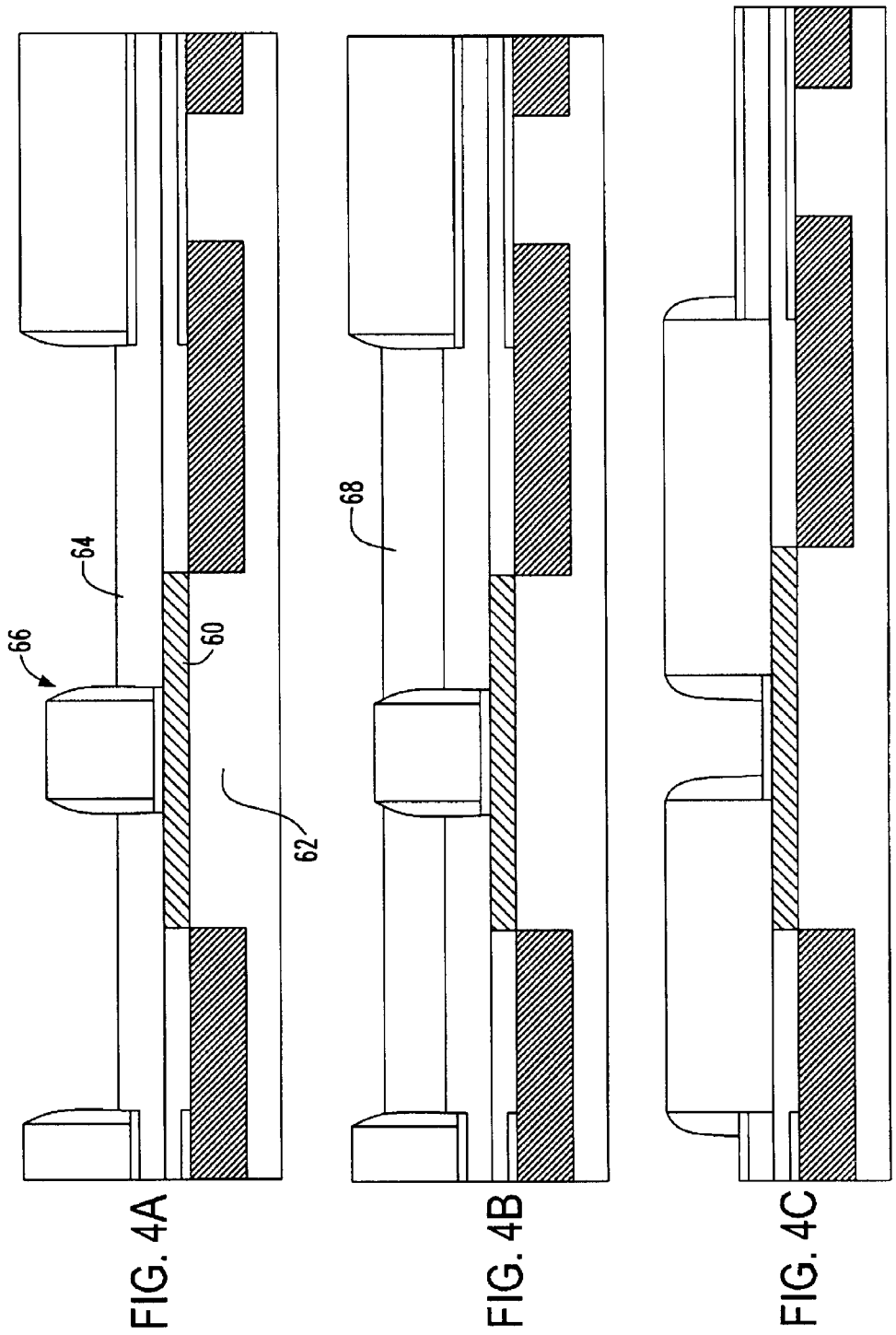
FIGS. 4A through 4C illustrate a method of fabricating a self-aligned heterojunction bipolar transistor as described in commonly owned, co-pending U.S. patent application Ser. No. 09/962,738 filed Sep. 25, 2001, in which the raised extrinsic base is formed by a recessed layer of polysilicon self-aligned to the emitter.
Figure 5:
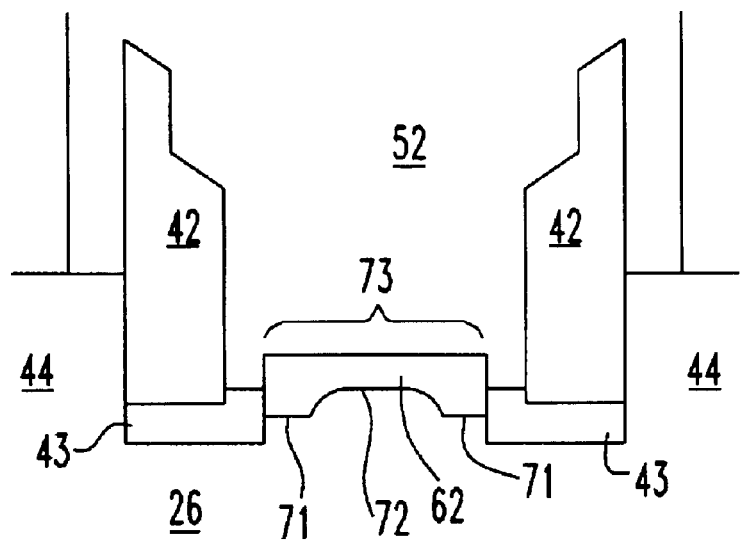
FIGS. 5 and 6 illustrate a method of fabricating a hetrojunction bipolar transistor as described in commonly owned, co-pending U.S. patent application Ser. No. 10/008,383 filed Dec. 6, 2001.
Figure 6:
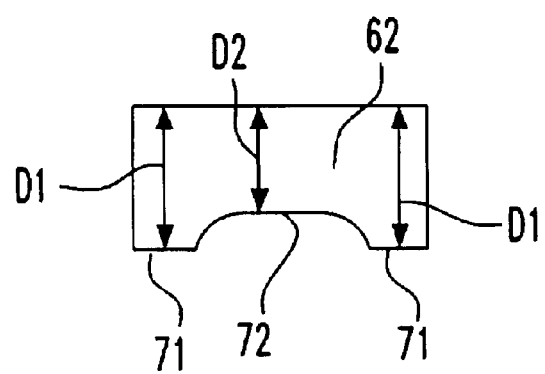
Figure 7:
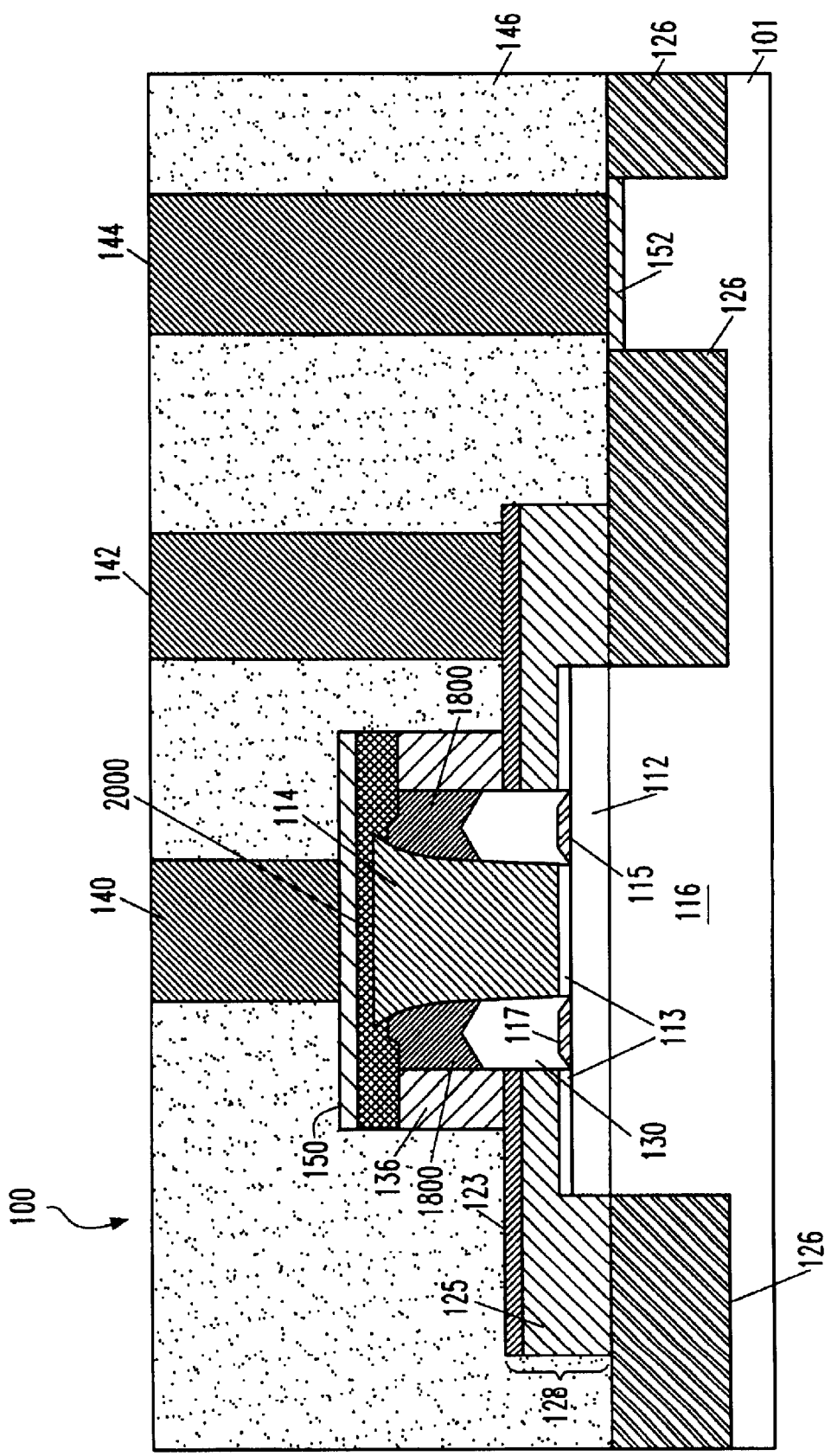
FIG. 7 illustrates a heterojunction bipolar transistor having a gap disposed between the emitter and the base according to one embodiment of the invention.

FIG. 7 is a cross-sectional view illustrating a heterojunction bipolar transistor (HBT) 100 according to a first embodiment of the invention. As shown in FIG. 7, HBT 100 is desirably fabricated from a substrate 101, e.g. wafer, of single-crystal silicon. The HBT 100 includes a collector 116, an intrinsic base 112 overlying the collector 116 region, and an emitter 114 disposed within an opening overlying the intrinsic base 112. In an embodiment, the intrinsic base consists essentially of single-crystal silicon. In another embodiment, the intrinsic base includes a layer of single-crystal semiconductor alloy such as silicon germanium (SiGe). The intrinsic base is doped with an impurity to provide the opposite type of conductivity (e.g. p-type conductivity) as the emitter and the collector, which have the same type of conductivity (e.g. n-type conductivity).

A raised extrinsic base 128 overlies the intrinsic base 112 and is conductively connected thereto, the raised extrinsic base including a layer of polycrystalline semiconductor material 125 such as polysilicon or polycrystalline silicon germanium (SiGe). The raised extrinsic base 128 desirably includes a low-resistance layer 123 including a metal or metal silicide, overlying the polycrystalline semiconductor layer 125. The raised extrinsic base 128 has an annular shape, surrounding the emitter 114.

A semiconductor material layer 113 known as an intrinsic layer is provided between the emitter 114 and the intrinsic base 112 and between the raised extrinsic base and the intrinsic base 112. This layer is typically a relatively thin layer, which initially has a light dopant concentration but takes on a higher dopant concentration and conductivity type as a result of dopant diffusion from layers with which it is in contact. Layer 113 has the conductivity type of the emitter 114 where it underlies the emitter 114 and has the conductivity type of the raised extrinsic base 128 where it underlies the raised extrinsic base 128.

Between the emitter 114 and the raised extrinsic base 128, layer 113 is recessed or removed. In its place, a layer of oxide 117 desirably contacts a top surface 115 of the intrinsic base 112. The space between the emitter 114 and raised extrinsic base 128 is occupied by a gap 130, which is an air gap or vacuum void. The space above the gap 130 is capped by a deposited dielectric material which is preferably silicon dioxide. Hereinafter, this structure will be referred to as a spacer cap 1800, for ease of reference.

The emitter 114 extends downwardly to contact the intrinsic base 112 through an opening in the raised extrinsic base 128. Oxide regions 136 and 1800 separate an upper portion 2000 of the emitter from the raised extrinsic base 128.

The emitter 114 can be made out of a variety of semiconductor materials such as polysilicon or polycrystalline SiGe. Vertical contact to each of the raised extrinsic base 128, emitter 114 and collector reach-through region 103 from a overlying wiring level (not shown) is provided through metal or metal-silicide filled vias 140, 142, and 144 that are etched into an overlying deposited interlevel dielectric layer (ILD) 146. Desirably, ILD 146 consists essentially of a deposited oxide, for example, silicon dioxide such as oxide deposited from a tetraethylorthosilicate (TEOS) precursor or borophosphosilicate glass (BPSG).

A method of fabricating an HBT 100 according to an embodiment of the invention is illustrated in FIGS. 8 through 20. As depicted in FIG. 8, a single-crystal silicon substrate 101 is patterned to form a first active area 102 and a second active area 103, and shallow trench isolations 126 between the active areas 102 and 103. The shallow trench isolations 126 are formed by directionally etching trenches in the substrate 101, and then filling the trenches with a dense oxide, such as may be provided by a high electron density plasma (HDP) deposition.

A layer 105 of dielectric material, preferably consisting of silicon dioxide deposited from a TEOS precursor, is deposited over the substrate and photolithographically patterned to expose the first active area 102 but not the second active area 103. Active area 102 is then ion implanted, or otherwise doped to form collector 116. When the HBT is an npn transistor, the dopant source for this step is an n-type dopant such as arsenic and/or phosphorous.

As also depicted in FIG. 8, a layer 112 of semiconductor material including a dopant of the opposite type as the collector is epitaxially grown onto the surface of the substrate in active area 102. This layer 112 becomes an intrinsic base layer of the transistor when completed. When the HBT is an npn transistor, the dopant source for this step is a p-type dopant such as boron. Preferably, the intrinsic base layer 112 includes a semiconductor alloy such as silicon germanium (SiGe) having a substantial percentage content of germanium. Such layer 112 desirably has a germanium content which is greater than 20%, while the. silicon content makes up a complementary percentage. Carbon may also be incorporated at small amount, i.e., less than one percent, to reduce diffusion of the dopants in subsequent processing. In one embodiment of the invention, the SiGe layer 112 is grown using non-selective epitaxy. A second layer 113 of semiconductor material, thinner than layer 112 and having a lowered dopant concentration compared to the intrinsic base 112, is then epitaxially grown over intrinsic base layer 112. This layer 113 is subject to being doped by overlying layers which are subsequently formed in contact therewith, as by dopant outdiffusion therefrom.

Figure 9B:
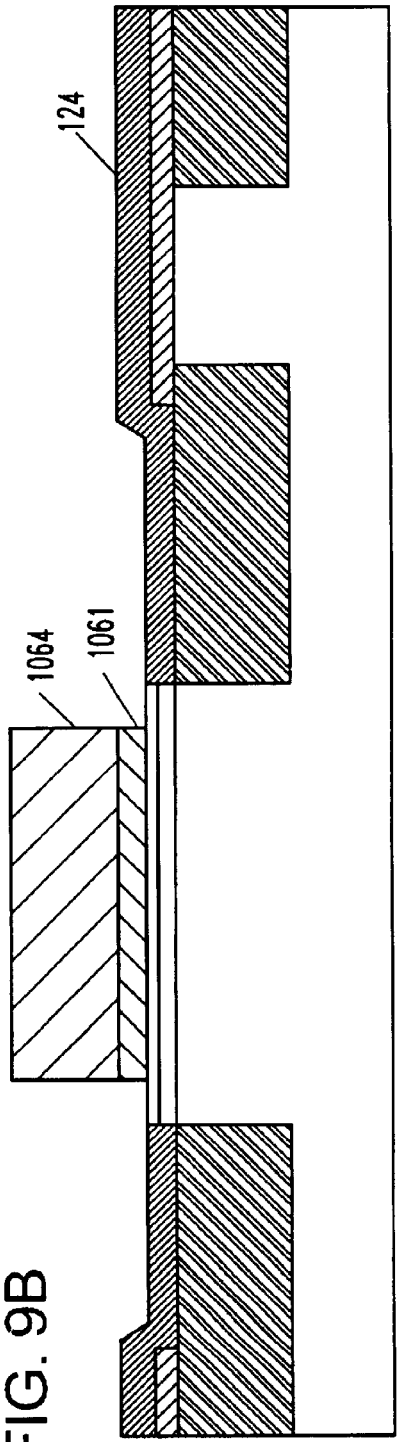
Figure 9C:
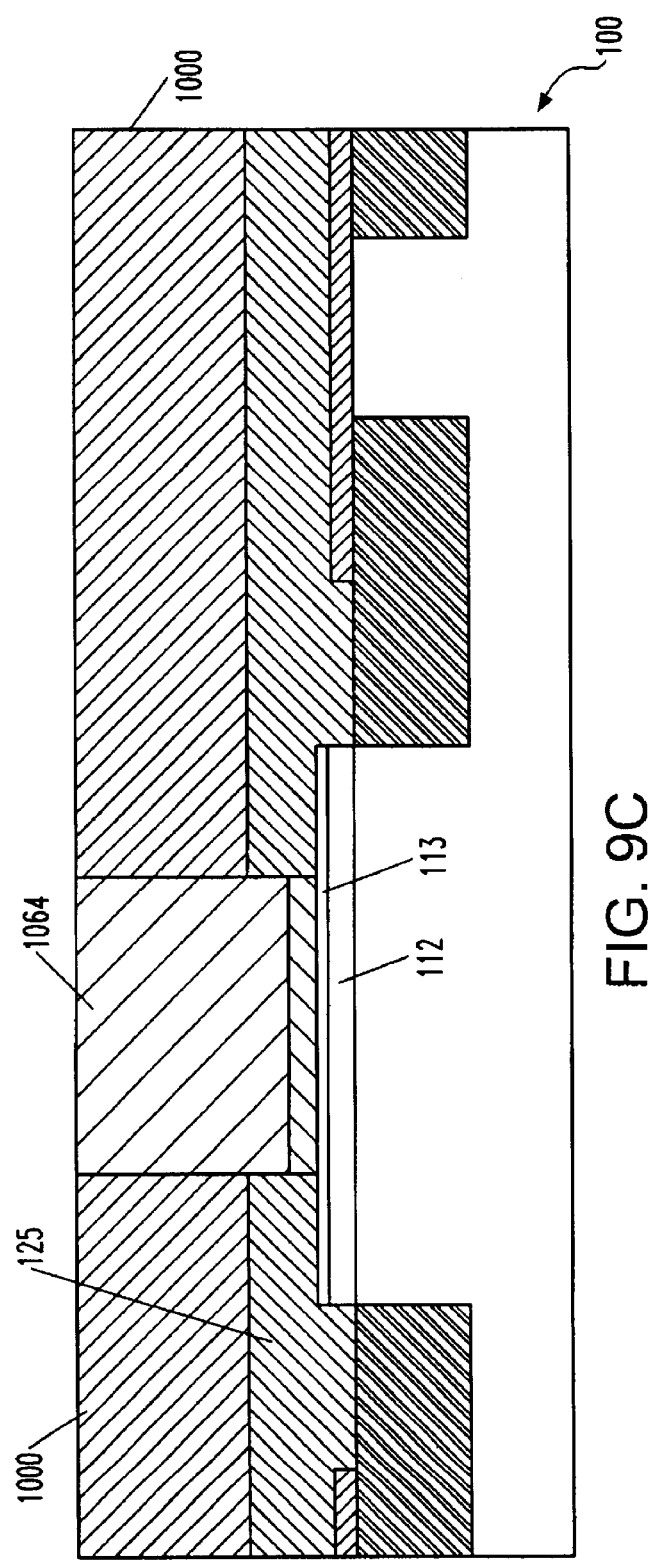

Thereafter, with reference to FIGS. 9A–9C and 10, steps are performed to define the lateral dimension of the emitter. As shown in FIG. 9A, a thin layer of oxide (e.g. silicon dioxide) 1061 is deposited over single-crystal layer 113 and polycrystalline base layer 125. Thereafter, a relatively thick layer 1064 of silicon nitride is deposited over the oxide layer. FIG. 9B depicts the resulting structure after photolithographically patterning the nitride layer 1064, and then patterning the oxide layer 1061 as by a wet etch, selective to nitride and to silicon. Thereafter, as shown in FIG. 9C, a layer of polysilicon 125 is deposited over single-crystal layer 113 and preexisting polysilicon layer 124. This may be accomplished through deposition, CMP planarization and etch-back, or by selective deposition. This step is followed by blanket deposition of an additional oxide layer 1000. The oxide layer is then planarized to the level of the nitride layer 1064, as by an etchback process selective to nitride, or chemical mechanical polishing (CMP), resulting in the structure as shown.

FIG. 10 depicts the structure after removing the nitride layer 1064, as by etching, selective to oxide, and then forming a relatively thick nitride spacer 1062 in the opening 1060. Such spacer 1062 is formed, typically by conformally depositing a relatively thick layer of silicon nitride, and then vertically etching the nitride layer, as by a reactive ion etch (RIE), until the underlying oxide layer 1061 is exposed.

As illustrated in FIG. 11, the underlying oxide layer 1061 is thereafter removed from the opening 1060, as by a wet etch, leaving oxide pad 1174. A further layer 1100 of polysilicon is deposited over layer 113 within the opening as an emitter contact layer.

Thereafter, as shown in FIG. 12, the emitter polysilicon layer 114 is recessed, as by CMP, or by etching the polysilicon selectively to oxide and nitride. Then, as shown in FIG. 13, the oxide layer 1000 is recessed, as by RIE or a wet etch, in a process selective to at least nitride. Thereafter, as shown in FIG. 14, the nitride spacer 1062 is removed, as by wet etching, selective to oxide and to polysilicon, to form an annular opening 1400. As illustrated in FIG. 15, the oxide pad 1174 is then removed, as by wet etching selective to the underlying semiconductor material.

Thereafter, as illustrated in FIG. 16, layer 113 is removed from inside the annular opening 1400, as by a wet etch, selective to the material of the intrinsic base layer 112. Ordinarily, dopants diffuse laterally outward from the emitter 114 into this region, such that an unnecessary p-n junction exists by the juxtaposition of this outdiffusion region to the intrinsic base 112. By removing the lightly doped layer 113 in region 1400, the junction is eliminated in region 1400, thereby eliminating its contribution to the emitter-base junction capacitance. Selectivity is achieved because at least the conductivity (p- and n-) types of layer 112 and 113 vary, and preferably the materials also vary between SiGe and silicon. Alternatively, a timed etch can be performed to remove semiconductor material to a desired recess depth. Other more exact etching techniques can also be utilized such as a plasma etching technique such as a plasma RIE or a plasma dry chemical etch (DCE), as well as other methods that involve oxidation of layer 113 followed by wet stripping using an etchant such as hydrofluoric acid (HF).

In FIG. 17, a non-conformal layer 1700 of oxide is deposited over the structure, including over the oxide layer 1000, on the emitter 114 and inside the annular opening 1400. Since this new layer of oxide is non-conformal, the annular opening 1400 is not entirely filled, as illustrated in FIG. 17. The oxide is deposited on the sidewalls of layer 1000 and on the bottom of the opening 1400. The quantity of material resulting at the bottom of opening 1400 is small due to the reduced opening resulting from the sidewall deposition. In this way, an annular oxide pad 117 is formed on a top surface 115 of the intrinsic base layer 112. In addition, an annular gap 1730 results between the emitter 114 and the sidewalls of the layers 125, 1000 of polysilicon and oxide inside the annular opening 1400. The deposition of this layer of oxide 1700 can be conducted using a technique such as plasma enhanced chemical vapor deposition (PECVD).

Thereafter, as shown in FIG. 18, the oxide layer 1700 is recessed until the top surface 214 of the emitter 114 is cleared of oxide. Such recessing process can be conducted by an etching technique such as a RIE or a wet etch. This process results in the formation of an annular oxide spacer cap 1800 overlying the gap 1730.

Figure 20:
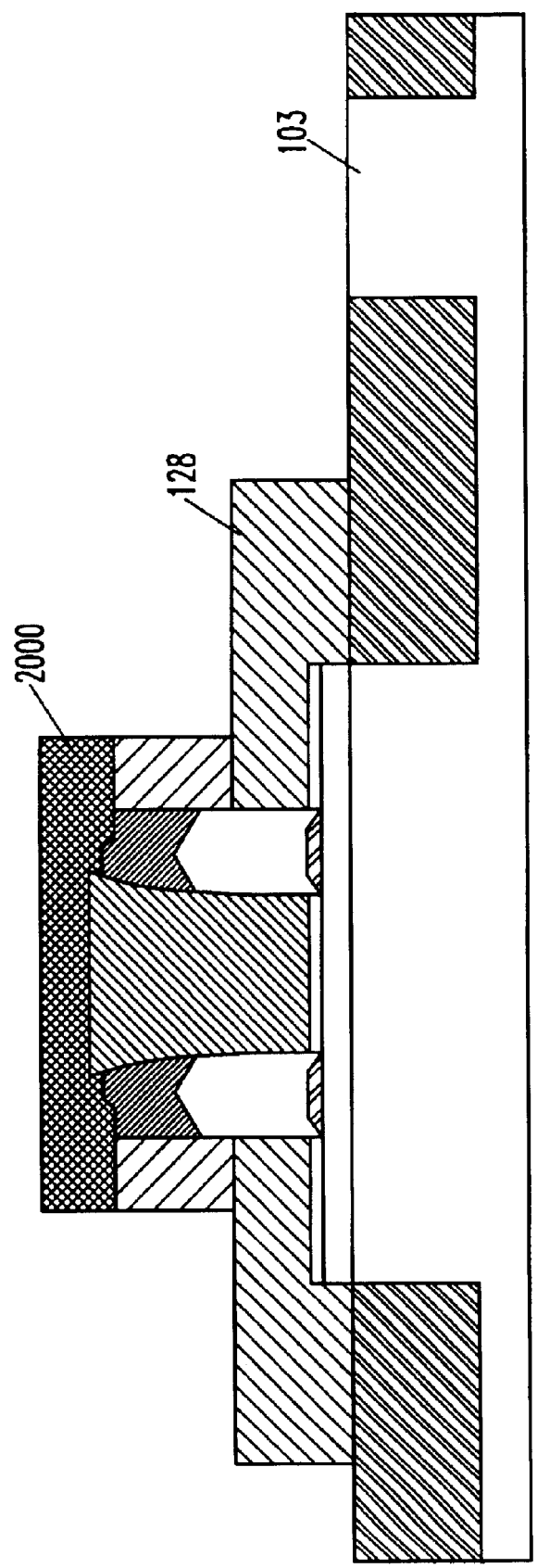

As depicted in FIG. 19, a further emitter layer 1900 is deposited over the structure, preferably including polysilicon, but which can alternatively consist essentially of a metal, a metal silicide or other conductive metal compound which is compatible with polysilicon, or a combination of the foregoing. Thereafter, as shown in FIG. 20, an upper portion 2000 of the emitter 114 is photolithographically defined, followed by the photolithographic definition of the raised extrinsic base 128. Thereafter, the oxide layer 105 (FIG. 8) is removed, to expose the collector reach-through area 103. It is at this time that an optional self-aligned silicidation process can be performed when the layer 1900 consists essentially of polysilicon to form the aforementioned silicide layers 123, 150 and 152 which overlie the emitter 114, raised extrinsic base polysilicon layer 125 and collector reach-through area 103, as shown in FIG. 7.

Referring to FIG. 7 again, a thick interlevel dielectric layer (ILD) 146 is then formed over the structure. ILD 146 consists essentially of a deposited oxide, for example a silicon dioxide such as a TEOS oxide or borophosphosilicate glass (BPSG). Vias 140, 142, and 144 are then etched in the ILD 146 and subsequently filled with a metal, metal silicide or other conductive metal compound or combination of the foregoing to form the structure discussed above with reference to FIG. 7.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A bipolar transistor, comprising:
   a collector;
   an intrinsic base overlying said collector;
   an emitter overlying said intrinsic base; and
   an extrinsic base spaced from said emitter by a gap, said gap including at least one of an air gap and a vacuum void.

2. A bipolar transistor as claimed in claim 1, wherein said gap includes only an air gap.

3. A bipolar transistor as claimed in claim 2, further comprising a solid dielectric material having a lower surface disposed over said gap and an upper surface underlying an overhanging portion of said emitter.

4. A bipolar transistor as claimed in claim 1, wherein said gap includes only a vacuum gap.

5. A bipolar transistor as claimed in claim 1, wherein said bipolar transistor further includes a semiconductor layer overlying said intrinsic base, wherein said emitter and said extrinsic base overlie said semiconductor layer.

6. A bipolar transistor as claimed in claim 5, wherein said gap overlies an opening in said semiconductor layer.

7. A bipolar transistor as claimed in claim 6, further comprising a solid dielectric material disposed on said intrinsic base in said opening.

8. A bipolar transistor as claimed in claim 1, wherein said bipolar transistor includes a raised extrinsic base, wherein said raised extrinsic base includes a polycrystalline semiconductor layer and a low resistance layer disposed above said polycrystalline semiconductor layer, said low resistance layer including at least one material selected from metals and metal silicides.

9. A bipolar transistor as claimed in claim 8, wherein low resistance layer includes a salicide.

10. A bipolar transistor as claimed in claim 1, wherein said intrinsic base includes a layer of a single-crystal semiconductor alloy, said single-crystal semiconductor alloy forming a heterojunction with at least one of said emitter and said collector.

11. A method of making a bipolar transistor, comprising:
    forming a collector and an intrinsic base overlying said collector;
    forming an emitter overlying said intrinsic base and an extrinsic base spaced from said emitter by a gap, said gap including at least one of an air gap and a vacuum void.

12. A method of making a bipolar transistor as claimed in claim 11, wherein said gap includes only an air gap.

13. A method of making a bipolar transistor as claimed in claim 12, further comprising a forming a region of solid dielectric material having a lower surface disposed over said gap and an upper surface underlying an overhanging portion of said emitter.

14. A method of making a bipolar transistor as claimed in claim 11, wherein said gap includes only a vacuum gap.

15. A method of making a bipolar transistor as claimed in claim 11, further comprising making a semiconductor layer overlying said intrinsic base, wherein said emitter and said extrinsic base overlie said semiconductor layer.

16. A method of making a bipolar transistor as claimed in claim 15, further comprising forming an opening in said semiconductor layer and forming said gap over said opening.

17. A method of making a bipolar transistor as claimed in claim 16, further comprising forming an oxide disposed on said intrinsic base in said opening.

18. A method of making a bipolar transistor as claimed in claim 11, wherein said extrinsic base is formed as a raised extrinsic base including a polycrystalline semiconductor layer and a low resistance layer disposed above polycrystalline semiconductor layer, said low resistance layer including at least one material selected from metals and metal silicides.

19. A method of making a bipolar transistor as claimed in claim 18, wherein said low resistance layer includes a salicide.

20. A method of making a bipolar transistor as claimed in claim 11, wherein said intrinsic base is formed to include a layer of a single-crystal semiconductor alloy, said single-crystal semiconductor alloy forming a heterojunction with at least one of said emitter and said collector.

* * * * *